United States Patent
Ebbecke

(10) Patent No.: US 10,270,223 B2
(45) Date of Patent: Apr. 23, 2019

(54) SEMICONDUCTOR LASER DIODE AND METHOD FOR PRODUCING A SEMICONDUCTOR LASER DIODE

(71) Applicant: OSRAM Opto Semiconductors GmbH, Regensburg (DE)

(72) Inventor: Jens Ebbecke, Rohr in Niederbayern (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/578,237

(22) PCT Filed: May 25, 2016

(86) PCT No.: PCT/EP2016/061835
§ 371 (c)(1),
(2) Date: Nov. 29, 2017

(87) PCT Pub. No.: WO2016/193102
PCT Pub. Date: Dec. 8, 2016

(65) Prior Publication Data
US 2018/0152002 A1     May 31, 2018

(30) Foreign Application Priority Data
May 29, 2015    (DE) .......... 10 2015 108 529

(51) Int. Cl.
*H01S 5/10* (2006.01)
*H01S 5/02* (2006.01)
(Continued)

(52) U.S. Cl.
CPC .......... *H01S 5/1075* (2013.01); *H01S 5/0217* (2013.01); *H01S 5/0224* (2013.01); *H01S 5/3054* (2013.01); *H01S 5/343* (2013.01); *H01S 5/0228* (2013.01)

(58) Field of Classification Search
CPC ...... H01S 5/1075; H01S 5/3054; H01S 5/343; H01S 5/0217; H01S 5/0224; H01S 5/0228
See application file for complete search history.

(56) References Cited

U.S. PATENT DOCUMENTS 6,134,257 A     10/2000   Capasso et al.
2012/0320939 A1  12/2012  Baets et al.

FOREIGN PATENT DOCUMENTS

CN      2422764 Y     3/2001
CN    101075726 A    11/2007
(Continued)

OTHER PUBLICATIONS

Shi-Jiang Wang et al: "AlGaInAs—InP Microcylinder Lasers Connected With an Output Waveguide", IEEE Photonics Technology Letters, vol. 22, No. 18, Sep. 15, 2010 (Sep. 15, 2010), pp. 1349-1351 , XP01 1312549.*
(Continued)

*Primary Examiner* — Dung Nguyen
(74) *Attorney, Agent, or Firm* — Slater Matsil, LLP

(57) ABSTRACT

A semiconductor laser diode and a method for manufacturing a semiconductor laser diode are disclosed. In an embodiment, the semiconductor laser diode includes a semiconductor layer sequence having an active zone, wherein the semiconductor layer sequence has a cylindrical shape, wherein a cylinder axis of the semiconductor layer sequence is perpendicular to a layer plane of the semiconductor layer sequence, and wherein the semiconductor laser diode is configured to emit radiation perpendicularly to the cylinder axis of the semiconductor layer sequence.

16 Claims, 2 Drawing Sheets

(51) Int. Cl.
     *H01S 5/022*     (2006.01)
     *H01S 5/30*      (2006.01)
     *H01S 5/343*     (2006.01)

(56) References Cited

FOREIGN PATENT DOCUMENTS

EP         1544967 A1     6/2005
WO     2012154209 A1   11/2012

OTHER PUBLICATIONS

Chern, G.D. et al., "Unidirectional Lasing from InGan Multiple-Quantum-Well Spiral-Shaped Micropillars," Applied Physics Letters, vol. 83, No. 9, Sep. 1, 2003, 4 pages.
Levi, A.F.J. et al., "Directional Light Coupling from Microdisk Lasers," Applied Physics Letters, vol. 62, No. 6, Feb. 8, 1993, 4 pages.
Levi, A.F.J. et al., "Room-Temperature Lasing Action in In0.51Ga0.49P/In0.2Ga0.8As Microcylinder Laer Diodes," Applied Physics Letters, vol. 62, No. 17, Apr. 26, 1993, 4 pages.
Li, Z. et al., "Coupling of Light from Microdisk Lasers to Nano-Antennas with Nano-Tapers," IEEE Photonics Conference, Sep. 23, 2012, 2 pages.
Mechet, P. et al., "Heterogeneously Integrated Microdisk Lasers for Optical Interconnects and Optical Logic," Proc. of SPIE, vol. 7913, Jan. 23, 2011, 9 pages.
Wang, S.J. et al., "AlGaInAs—InP Microcylinder Lasers Connected with an Output Waveguide," IEEE Phontonics Technology Letters, vol. 22, No. 18, Sep. 15, 2010, 3 pages.

\* cited by examiner

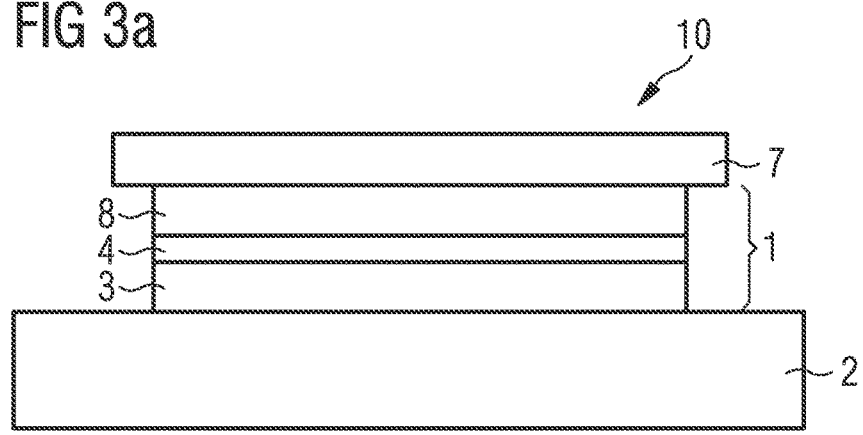
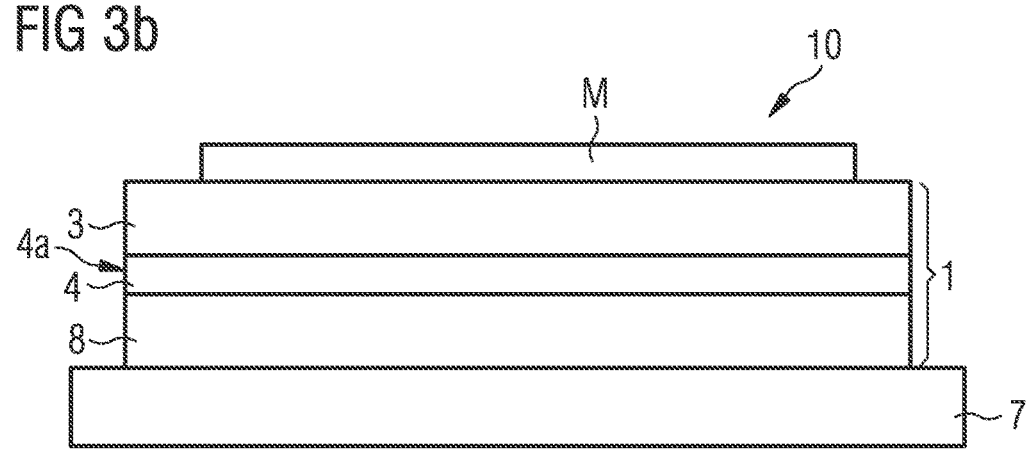

SEMICONDUCTOR LASER DIODE AND METHOD FOR PRODUCING A SEMICONDUCTOR LASER DIODE

This patent application is a national phase filing under section 371 of PCT/EP2016/061835, filed May 25, 2016, which claims the priority of German patent application 10 2015 108 529.1, filed May 29, 2015, each of which is incorporated herein by reference in its entirety.

TECHNICAL FIELD

The invention relates to a semiconductor laser diode and to a method for producing a semiconductor laser diode.

SUMMARY OF THE INVENTION

Embodiments provide a semiconductor laser diode and a method for producing such a semiconductor laser diode, wherein the semiconductor laser diode is distinguished by small-scale dimensions, is simple and inexpensive to produce and can be simply integrated in microtechnology applications.

A semiconductor laser diode may require a resonator for generating stimulated emission. This conventionally entails laser diodes as complex components which are relatively costly to produce. Mirrors as Bragg structures or mirrored surfaces are usually required for this purpose in order to achieve a resonator effect in the component. Such semiconductor laser diodes are usually distinguished by correspondingly large dimensions.

In various embodiments, the semiconductor laser diode comprises a semiconductor layer sequence comprising an active zone, wherein the semiconductor layer sequence is cylindrical and a cylinder axis of the semiconductor layer sequence is perpendicular to a layer plane of the semiconductor layer sequence. The semiconductor laser diode furthermore emits radiation generated during operation perpendicularly to the cylinder axis of the semiconductor layer sequence.

The semiconductor layer sequence may advantageously comprise a p-doped region and an n-doped region, wherein the active zone is in particular arranged between these two regions. The regions of the semiconductor layer sequence here advantageously comprise layer planes which are arranged parallel to and one above the other. A cylinder axis is here perpendicular to the layer planes, wherein the shape of the semiconductor layer sequence is rotationally symmetrical with regard to the cylinder axis. The active zone is electrically contacted via the p- and n-doped region, wherein p- or n-contacts may be arranged on the respective p- or n-doped region.

During operation of the semiconductor laser diode, the active zone generates light which is emitted in a direction perpendicular to the cylinder axis and is advantageously coupled out of the active zone at a point on the cylindrical surface.

According to at least one embodiment of the semiconductor laser diode, the active zone comprises an outer face which is symmetrical with regard to the cylinder axis and which, during operation of the semiconductor laser diode, forms a resonator by total reflection of radiation generated in the active zone.

In plan view from a direction along the cylinder axis, the active zone advantageously comprises a circular outer face. Along the direction of the cylinder axis, in the region of the active zone the outer face of the active zone at least in places forms the outer face of the semiconductor laser diode. Such an outer face is distinguished in that radiation generated in the active zone is reflected by total reflection on the outer face and remains in the interior of the active zone. Repeated reflection acts as a resonator for the radiation. The more perfect is the rotationally symmetrical shape or circular shape of the outer face, the better is the effect of the total reflection on the outer face to radiation from the interior of the active zone. A quality factor Q of the resonator may thus advantageously be influenced by the rotationally symmetrical shape. Any deviations from the rotationally symmetrical shape of the outer face accordingly promote outcoupling of the radiation from the active zone.

In the case of a resonator with a cylindrical shape which is sufficiently small-scale, for example, comprising a base of the cylinder with a diameter of 1 µm to 100 µm, an optical resonator mode in the form of a "whispering-gallery mode" can form in the active zone. Such a resonator mode is capable of generating stimulated emission.

In order to increase the efficiency of radiation generation, it is furthermore possible for non-radiative losses in the active zone, for instance resulting from electron-hole recombination, to be reduced. This may suitably and advantageously be achieved by passivation or regions in the active zone with local p-doping, by means of which, for example, barriers to electrons are formed within the active zone, so resulting in a reduction in non-radiative recombination at the outer face or outer region of the active zone. In this manner, the efficiency of the resonator and the efficiency of emission of the semiconductor laser diode is advantageously increased. Passivation is here advantageously applied to the outer face of the semiconductor layer sequence, in particular on the outer face of the active zone. The passivation advantageously peripherally surrounds the semiconductor layer with a constant thickness, such that the passivation retains the cylindrical shape of the semiconductor layer sequence.

Accordingly, in addition to or instead of the passivation, it is also possible to form a region of the semiconductor layer sequence, in particular of the active zone, with p-doping in the outer region of the cylindrical shape. Once the cylindrical shape has been formed, acceptor atoms are here diffused into the cylindrical surface of the active zone, such that p-doping is produced locally on the surface of the nominally undoped active zone.

According to at least one embodiment of the semiconductor laser diode, the outer face comprises at least one exit point for the radiation generated in the active zone during operation.

The radiation can exit or be coupled out from the active zone through the exit point. It is here advantageous for the radiation to exit from the active zone exclusively at this exit point. It is furthermore also conceivable for the active zone to comprise further exit points for the radiation on its outer face.

According to at least one embodiment of the semiconductor laser diode, the outer face of the active zone comprises a deviation from the cylindrical shape at the exit point, through which the radiation generated in the active zone during operation exits from the semiconductor laser diode.

In the region of the exit point, the rotational symmetry of the outer face of the active zone with regard to the cylinder axis advantageously deviates from the cylindrical or circular shape. In this region, the degree of total reflection is reduced and the radiation resonating in the active zone can be coupled out at this exit point. Any conceivable surface shapes, for example, concave or convex arcuate shapes or also roughened portions, are advantageously possible here.

Such deviations from rotational symmetry may advantageously be provided during the production process for the semiconductor layer sequence, in particular during formation of the cylindrical shape. For example, during production of the cylindrical shape by means of a lithography method, a deformation in the cylindrical shape may be produced in the region of the exit point during etching of the cylindrical shape.

According to at least one embodiment of the semiconductor laser diode, an outcoupling structure for outcoupling the radiation generated in the active zone during operation is arranged at the exit point.

According to at least one embodiment of the semiconductor laser diode, the outcoupling structure has a refractive index which differs from that of the active zone.

The outcoupling structure is advantageously arranged on the outer face of the active zone as a separate structure comprising a material which differs from that of the active zone above all with regard to its refractive index.

According to at least one embodiment of the semiconductor laser diode, the outcoupling structure comprises a dielectric layer and/or a plasmonic structure.

The dielectric layer is advantageously distinguished by a difference in refractive index relative to the active zone. The dielectric layer is advantageously applied as an additional outcoupling structure at the exit point after production of the cylindrical shape, for example, after an etching process.

It is furthermore possible for the outcoupling structure to comprise a plasmonic structure. A plasmonic structure, for example, comprises a nanoscale metal structure in the form of a circle, rectangle or a grid structure.

It is furthermore also possible for the outcoupling structure to comprise a plurality of dielectric layers and/or plasmonic structures.

According to at least one embodiment of the semiconductor laser diode, the semiconductor layer sequence comprises a p-doped semiconductor layer, wherein a contact layer is arranged on the latter, wherein a refractive index of the contact layer is lower than a refractive index of the p-doped semiconductor layer.

According to at least one embodiment of the semiconductor laser diode, a carrier is arranged on a side facing the contact layer.

It is here advantageously possible for a growth substrate to have been removed from the semiconductor layer sequence and for the carrier to differ from the growth substrate for the semiconductor layer sequence. The p-doped semiconductor layer may, for example, comprise GaAs or AlGaAs. The refractive index of the p-doped semiconductor layer amounts, for example, to n=3.4 for light of a wavelength of 620 nm or to n=2.4 for light of a wavelength of 450 nm. The contact layer comprises, for example, ITO or ZnO. The refractive index of the contact layer amounts, for example, to n=1.8 for ITO for light of a wavelength of 620 nm and to n=2 for ZnO for light of a wavelength of 620 nm. Decoupling of the resonator from the surroundings of the semiconductor laser diode may advantageously be improved in this manner. Improved decoupling can improve the quality of the semiconductor laser diode. Decoupling may also be improved by the semiconductor layer sequence having the least possible contact with a substrate or carrier. With regard to decoupling the resonator, transferring the semiconductor layer sequence from a growth substrate onto a carrier, in particular in the case of material systems based on arsenides or phosphides, has proven advantageous in comparison with remaining on the growth substrate.

According to at least one embodiment of the semiconductor laser diode, a base of the cylindrical semiconductor layer sequence has a diameter of 1 µm to 100 µm.

Such an order of magnitude of the semiconductor laser diode provides the advantage that the latter is relatively small in comparison with conventional semiconductor laser diodes, whereby it is simple to integrate and can be produced with little effort as an inexpensive mass-produced product. Advantageously, such a semiconductor laser diode may readily be integrated into microtechnology applications.

According to at least one embodiment of the semiconductor laser diode, the active zone comprises a single quantum well structure or a multiple quantum well structure.

It is advantageous to use some few quantum well structures in the active zone for efficient generation of stimulated emission in the semiconductor laser diode. In particular, using from one to 10 quantum well structures has proven advantageous.

According to at least one embodiment of the semiconductor laser diode, the semiconductor layer sequence comprises one of the material systems InGaN, AlInGaP, or AlGaAs.

The semiconductor layers are in particular semiconductor layers based on a III-V semiconductor material. For example, the semiconductor layers are based on a nitride compound semiconductor material such as $Al_nIn_{1-n}Ga_mN$ or on a phosphide compound semiconductor material such as $Al_nIn_{1-n}Ga_mP$ or on an arsenide compound semiconductor material $Al_nIn_{1-n}Ga_mAs$, wherein in each case $0 \le n \le 1$, $0 \le m \le 1$ and $n+m \le 1$ apply. This material may comprise one or more dopants as well as additional constituents. For simplicity's sake, however, only the fundamental constituents of the crystal lattice are indicated, i.e., Al, Ga, In, N or P or As, even if these may in part be replaced and/or supplemented by small quantities of further substances.

In a method for producing a semiconductor laser diode, a semiconductor layer sequence with an active zone is provided, and a cylindrical shape of the semiconductor layer sequence is produced by means of an etching process, wherein the semiconductor layer sequence has a cylinder axis perpendicular to a layer plane of the semiconductor layer sequence.

The semiconductor layer sequence may be formed, for example, on a substrate, wherein an n-doped semiconductor region is advantageously arranged on the substrate. Subsequently, the active zone and thereafter a p-doped semiconductor region may be arranged on the n-doped semiconductor region. The n- and/or p-doped region may here be transparent to the radiation generated in the active zone. Subsequently, it is advantageously possible for a carrier to be arranged on the p-doped semiconductor region and the substrate to be removed from the n-doped semiconductor region.

The semiconductor layer sequence may be formed into a cylindrical shape by means of an etching process, for example, using a mask which is applied to the carrier. The etching process may proceed wet chemically or dry chemically and form mesas.

With regard to the cylinder axis, which is perpendicular to a layer plane of the semiconductor layer sequence, the semiconductor layer sequence advantageously comprises a rotationally symmetrical outer face which, in the case of an etching process with a mask, advantageously corresponds to the outer shape of the mask. Smooth and homogeneous outer faces of the cylindrical shape are obtained by sufficient precision of the etching process. Smooth and homogeneous outer faces advantageously promote total reflection of radiation within the active zone, whereby a resonator effect for radiation in the active zone is improved. The accuracy of the formation of the cylindrical shape, i.e., the rotationally symmetrical shape, may advantageously be adjusted during the course of the etching process.

In the method, an exit point for the radiation generated in the active zone during operation of the semiconductor laser diode is furthermore formed on an outer face of the active zone, such that the radiation is emitted through the exit point perpendicularly to the cylinder axis of the semiconductor layer sequence.

It is furthermore possible to produce a plurality of exit points for the radiation on the active zone.

The exit point may be formed during the shaping process for the cylindrical shape or thereafter.

According to at least one embodiment of the method, the semiconductor layer sequence comprises a p-doped semiconductor layer and, after growth on the substrate, a contact layer is arranged on the p-doped semiconductor layer, the semiconductor layer sequence is arranged with a side remote from the substrate on a carrier, and thereafter the substrate is removed from the semiconductor layer sequence. The substrate is advantageously a growth substrate for the semiconductor layer sequence.

According to at least one embodiment of the method, the contact layer comprises ITO or ZnO.

According to at least one embodiment of the method, the cylindrical shape of the semiconductor layer sequence is produced by means of a lithography method.

A mask for forming the cylindrical shape is used in the lithography method. The mask, for example, applied onto the semiconductor layer sequence may advantageously serve to predetermine a shape of the outer face of the cylinder. An etching process advantageously proceeds from a direction along the cylinder axis. It is here possible for a p-contact applied onto the semiconductor layer sequence to serve as a hard mask for the lithography process.

According to at least one embodiment of the method, a deviation from the cylindrical shape of the outer face of the active zone is formed at the exit point during the lithography method.

The exit point may, for example, be formed such that it comprises a deviation from the cylindrical shape of the outer face of the active zone, so promoting outcoupling of radiation generated in the active zone during operation.

Any conceivable surface shapes, for example, concave or convex arcuate shapes or also roughened portions, may advantageously be formed. Such deviations from rotational symmetry may advantageously be provided during the production process of the semiconductor layer sequence, in particular during formation of the cylindrical shape. For example, during production of the cylindrical shape by means of an etching method, a deformation in the cylindrical shape may simultaneously be produced in the region of the exit point.

According to at least one embodiment of the method, after production of the cylindrical shape of the semiconductor layer sequence, an outcoupling structure is arranged on the outer face at the exit point.

The exit point may take the form of an outcoupling structure for outcoupling the radiation generated in the active zone during operation, wherein the outcoupling structure advantageously comprises a material which differs from the active zone with a refractive index which differs from that of the active zone. Total reflection may thus simply be reduced at a specific point of the outer face of the active zone. Along the cylinder axis, in the region of the active zone, the outer face of the active zone at least in places forms an outer face of the semiconductor laser diode and the outcoupling structure is advantageously arranged in this region.

The active zone here advantageously comprises passivation or a p-doped region on the outer face for reducing non-radiative electron-hole recombinations, wherein the outcoupling structure is arranged on this area of passivation or the p-doped region.

The outcoupling structure may be a dielectric layer and/or a plasmonic structure.

According to at least one embodiment of the method, the semiconductor layer sequence is grown epitaxially on a substrate.

For example, an n-doped semiconductor material is grown on a growth substrate in a thin-film process. In the further epitaxial process, an active zone and a p-doped semiconductor material are grown on the n-doped semiconductor material. Subsequently, the semiconductor layer sequence may be provided with n- and p-contacts and advantageously rebonded onto a carrier with the p-doped semiconductor material and the growth substrate removed again.

BRIEF DESCRIPTION OF THE DRAWINGS

Further advantageous embodiments and further developments are revealed by the exemplary embodiment described below in connection with the figures.

In the figures:

FIGS. 3a and 3b show the semiconductor laser diode in a schematic side view during the production method.

Identical or identically acting elements are provided with identical reference numerals in each of the figures. The components illustrated in the figures and the size ratios of the components to one another should not be regarded as to scale.

DETAILED DESCRIPTION OF ILLUSTRATIVE EMBODIMENTS

Figure 1:
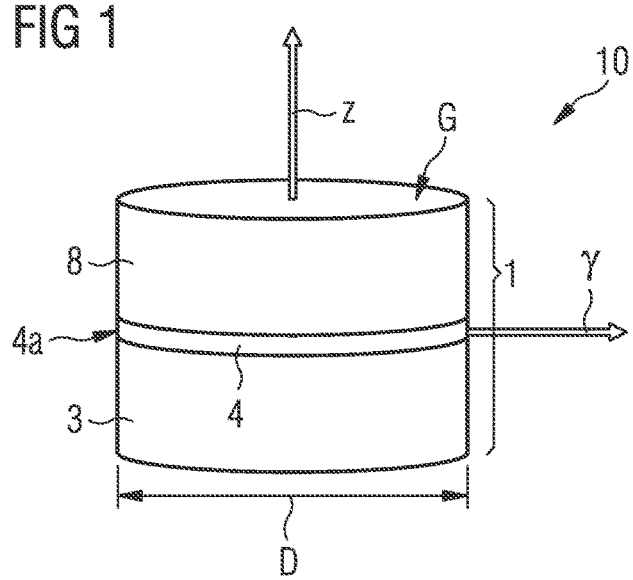
FIG. 1 shows a semiconductor laser diode in cylindrical shape.

FIG. 1 shows the semiconductor layer sequence 1 of the semiconductor laser diode 10 in schematic view, wherein the semiconductor layer sequence 1 comprises an n-doped semiconductor region 3, an active zone 4 and a p-doped semiconductor region 8. The p- and n-doped semiconductor regions and the active zone may advantageously comprise semiconductor layers based on III-V semiconductor materials. For example, the semiconductor layers are based on a nitride compound semiconductor material such as $Al_nIn_{1-n}Ga_mN$ or on a phosphide compound semiconductor material such as $Al_nIn_{1-n}Ga_mP$ or on an arsenide compound semiconductor material $Al_nIn_{1-n}Ga_mAs$, wherein in each case $0 \leq n \leq 1$, $0 \leq m \leq 1$ and $n+m \leq 1$ apply. This material may comprise one or more dopants as well as additional constituents.

The active zone 4, for example, comprises a single quantum well structure or a multiple quantum well structure for efficiently generating stimulated emission in the semiconductor laser diode 10. In particular, the active zone 4 comprises less than or equal to 10 quantum well structures.

FIG. 1 furthermore shows a rotationally symmetrical, in particular circular, outer face 4a of the active zone 4. Corresponding to the active zone, the p- and n-doped semiconductor regions 3 and 8 here advantageously comprise rotationally symmetrical, in particular circular, outer faces with regard to a cylinder axis z. The cylinder axis z is perpendicular to layer planes of the semiconductor layer sequence 1.

FIG. 1 furthermore shows an emission of radiation γ which is generated in the active zone 4 during operation of the semiconductor laser diode 10 and is emitted from the active zone 4 in a direction perpendicular to cylinder axis z of the semiconductor layer sequence 1.

The cylindrical shape of the semiconductor layer sequence 1 is of relatively small-scale construction, for example, comprising a base G of the cylinder with a diameter D of 1 μm to 100 μm.

Except for the point at which the radiation γ exits from the semiconductor layer sequence 1, the active zone 4 comprises an outer face 4a which is particularly smooth and has a cylinder surface shape formed with high precision, in other words exhibits virtually no deviation from the rotational symmetry, in particular the circular shape, of the cylinder. The outer face 4a of the active zone 4 and the outer faces of the p- and n-doped semiconductor regions 3 and 8 advantageously have a circular shape in plan view from the direction of the cylinder axis z.

Figure 2A:
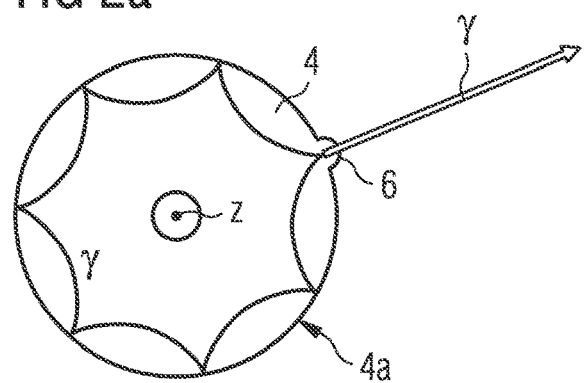
FIGS. 2a and 2b show a schematic plan view onto the active zone, which constitutes a resonator for the radiation.

FIG. 2a shows the active zone 4 in a schematic plan view from a direction along the cylinder axis z. The outer face 4a of the active zone 4 acts as a resonator for the radiation γ generated in the active zone 4, after the radiation γ is reflected by total reflection on the outer face 4a. This results in the development of a "whispering-gallery mode". The degree of total reflection is all the better, the more accurately the profile of the outer face 4a corresponds to the cylindrical shape of the semiconductor layer sequence or a circular shape with symmetry with regard to the cylinder axis z. At one point, which is provided for emission of the radiation γ from the active zone 4, the shape of the outer face 4a deviates from the cylindrical or circular shape. This is the case at the exit point 6. In the region of the exit point 6, the outer face 4a, for example, comprises a deviation from the cylindrical or circular shape or a roughened portion. Outcoupling and emission of the radiation γ from the active zone 4 perpendicular to the cylinder axis z is achieved thereby.

Figure 2B:
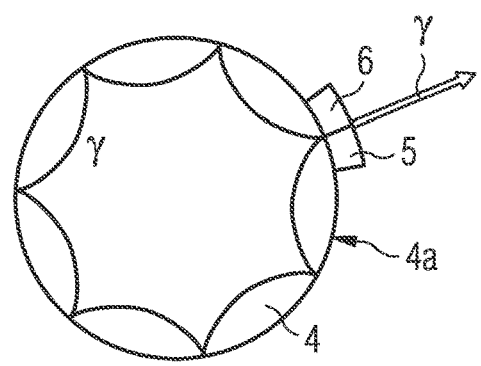

FIG. 2b shows a plan view onto the active zone 4 corresponding to FIG. 2a with the difference that the active zone 4 comprises an outcoupling structure 5 in the region of the exit point 6. The outcoupling structure 5 may be a dielectric layer and/or a plasmonic structure. The plasmonic structure advantageously comprises a nanoscale metal structure in the form of a circle, rectangle or a grid structure. The outcoupling structure 5 is advantageously applied in the region of the exit point 6 onto the outer face 4a of the active zone 4 or incorporated into the active zone. The outcoupling structure 5 as a dielectric layer exhibits a difference in refractive index in comparison with the active zone, whereby the total reflection for the radiation γ in the active zone 4 is reduced at this point and the proportion of radiation coupled-out through the outcoupling structure 5 is increased. The outcoupling structure 5 may be arranged subsequently on the completed semiconductor layer sequence.

FIG. 3a shows a schematic side view of the semiconductor laser diode 10 with the semiconductor layer sequence 1 during a production process. A sequence of semiconductor layers is arranged, for example, epitaxially, on a substrate 2. Furthermore, an active zone 4 and thereafter a p-doped semiconductor region 8 are arranged, advantageously grown, on the n-doped semiconductor region 3, such that the semiconductor layers have layer planes parallel to one another.

In a further method step, a carrier 7 is arranged on the side of the p-doped semiconductor region 8 remote from the substrate 2. For contacting, the carrier may advantageously comprise a p-contact and the semiconductor layer sequence can be rebonded onto the carrier.

FIG. 3b shows the arrangement of the semiconductor layer sequence 1 according to FIG. 3a, wherein in a further method step the substrate has subsequently been removed from the semiconductor layer sequence 1, after which the n-doped semiconductor region 3 is uncovered. Thereafter, the carrier 7 serves as the remaining carrying element of the semiconductor layer sequence 1. In a further method step, a mask M is arranged on the n-doped semiconductor region 3. The mask M, for example, serves to carry out a lithography step, wherein, viewed in plan view, the mask M has, for example, a circular shape and the semiconductor layer sequence 1 is transformed into the cylindrical shape by an etching process. A precise etching process transfers the circular shape of the mask M onto the outer faces of the semiconductor layer sequence 1, such that the circular shape of the outer face 4a of the active zone 4 promotes total reflection of radiation within the active zone. FIG. 3b shows the semiconductor layer sequence 1 once the mask M has been arranged and before the etching process has been carried out.

For the etching process, it is possible for the mask M to comprise a deviation from the circular shape in a region provided for the exit point. An exit point for the radiation, at which the outer face 4a of the active zone 4 deviates from the circular shape, may thus be produced simultaneously on the active zone with the etching process.

Passivation may advantageously subsequently be arranged on the outer face of the active zone.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. A semiconductor laser diode comprising:
   a semiconductor layer sequence having an active zone, the active zone comprising an outer face,
   wherein the outer face comprises an exit point for radiation generated in the active zone,
   wherein the semiconductor layer sequence has a cylindrical shape,
   wherein a cylinder axis of the semiconductor layer sequence is perpendicular to a layer plane of the semiconductor layer sequence; and
   an outcoupling structure for outcoupling the radiation generated in the active zone arranged at the exit point,
   wherein a refractive index of the outcoupling structure is different than a refractive index of the active zone, and
   wherein the semiconductor laser diode is configured to emit the radiation perpendicularly to the cylinder axis.

2. The semiconductor laser diode according to claim 1, wherein the outer face is symmetrical with regard to the cylinder axis and is configured to form a resonator by total reflection of the radiation generated in the active zone.

3. The semiconductor laser diode according to claim 1, wherein the outer face of the active zone comprises a deviation from the cylindrical shape at the exit point, through which the radiation generated in the active zone exits from the semiconductor laser diode.

4. The semiconductor laser diode according to claim 1, wherein the outcoupling structure comprises a dielectric layer and/or a plasmonic structure.

5. The semiconductor laser diode according to claim 1, wherein the semiconductor layer sequence comprises a p-doped semiconductor layer and a contact layer arranged on the latter, and wherein a refractive index of the contact layer is lower than a refractive index of the p-doped semiconductor layer.

6. The semiconductor laser diode according to claim 5, further comprising a carrier arranged on a side facing the contact layer.

7. The semiconductor laser diode according to claim 1, wherein a base of the semiconductor layer sequence has a diameter of 1 µm to 100 µm.

8. The semiconductor laser diode according to claim 1, wherein the active zone comprises a single quantum well structure or a multiple quantum well structure.

9. The semiconductor laser diode according to claim 1, wherein the semiconductor layer sequence comprises InGaN, InGaAlP, or AlGaAs.

10. A method for producing a semiconductor laser diode, the method comprising:
   providing a semiconductor layer sequence with an active zone;
   forming a cylindrical shape of the semiconductor layer sequence by an etching process, wherein the semiconductor layer sequence has a cylinder axis perpendicular to a layer plane of the semiconductor layer sequence; and
   forming an exit point configured to emit radiation generated in the active zone of the semiconductor laser diode on an outer face of the active zone, such that the radiation is emitted through the exit point perpendicularly to the cylinder axis of the semiconductor layer sequence,
   wherein the semiconductor layer sequence comprises a p-doped semiconductor layer and a contact layer arranged on the p-doped semiconductor layer, and
   wherein the contact layer comprises ITO or ZnO.

11. The method according to claim 10, further comprising growing the semiconductor layer sequence epitaxially on a substrate.

12. The method according to claim 11, further comprises arranging the semiconductor layer sequence with a side remote from the substrate on a carrier, and, thereafter, removing the substrate from the semiconductor layer sequence.

13. The method according to claim 10, wherein the cylindrical shape of the semiconductor layer sequence is produced by a lithography method.

14. The method according to claim 10, wherein a deviation from the cylindrical shape of the outer face of the active zone is formed at the exit point during lithography.

15. The method according to claim 10, further comprising, after forming the cylindrical shape of the semiconductor layer sequence, arranging an outcoupling structure on the outer face at the exit point.

16. A semiconductor laser diode comprising:
   a semiconductor layer sequence having an active zone,
   wherein the semiconductor layer sequence comprises a p-doped semiconductor layer and a contact layer arranged on the latter,
   wherein a refractive index of the contact layer is lower than a refractive index of the p-doped semiconductor layer,
   wherein a carrier is arranged on a side of the semiconductor laser diode facing the contact layer,
   wherein the semiconductor layer sequence is cylindrical,
   wherein a cylinder axis of the semiconductor layer sequence is perpendicular to a layer plane of the semiconductor layer sequence, and
   wherein the semiconductor laser diode is configured to emit radiation perpendicular to the cylinder axis of the semiconductor layer sequence.

* * * * *